US012813079B2

(12) United States Patent
Zhang

(10) Patent No.: US 12,813,079 B2
(45) Date of Patent: Nov. 24, 2026

(54) DISPLAY SUBSTRATE AND DISPLAY DEVICE

(71) Applicant: BOE Technology Group Co., Ltd., Beijing (CN)

(72) Inventor: Yue Zhang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 355 days.

(21) Appl. No.: 18/289,099

(22) PCT Filed: Feb. 27, 2023

(86) PCT No.: PCT/CN2023/078510
§ 371 (c)(1),
(2) Date: Oct. 31, 2023

(87) PCT Pub. No.: WO2024/178557
PCT Pub. Date: Sep. 6, 2024

(65) Prior Publication Data
US 2025/0089461 A1 Mar. 13, 2025

(51) Int. Cl.
*H10K 59/122* (2023.01)
*H10K 59/80* (2023.01)

(52) U.S. Cl.
CPC ......... *H10K 59/122* (2023.02); *H10K 59/873* (2023.02); *H10K 59/878* (2023.02); *H10K 59/879* (2023.02)

(58) Field of Classification Search
None
See application file for complete search history.

(56) References Cited

U.S. PATENT DOCUMENTS 11,914,103 B2 2/2024 Kim et al.
2014/0312312 A1 10/2014 Takii
2019/0067394 A1 2/2019 Cheon et al.
2019/0115404 A1 4/2019 Moon et al.
(Continued)

FOREIGN PATENT DOCUMENTS

CN 103915482 A 7/2014
CN 108123055 A 6/2018
(Continued)

OTHER PUBLICATIONS

May 30, 2026—(CN) First Office Action Appn 202380007930.7 with English translation.

*Primary Examiner* — Hung K Vu
(74) *Attorney, Agent, or Firm* — Banner & Witcoff, Ltd.

(57) ABSTRACT

A display substrate and a display device are provided, the display substrate includes: a base substrate; a light emitting element, located on the base substrate and including a first electrode, a second electrode, and a light emitting functional layer located between the first electrode and the second electrode; a pixel defining layer, including a pixel defining part and an opening configured to expose at least a part of the first electrode; and a filling layer, located on a side of the second electrode away from the base substrate; the pixel defining part includes a light extraction structure, and a refractive index of the filling layer is greater than a refractive index of the light extraction structure. The display substrate can enhance forward light emission, enhance light extraction effect, and improve light efficiency.

19 Claims, 6 Drawing Sheets

(56) References Cited

U.S. PATENT DOCUMENTS

| | | | | |
|---|---|---|---|---|
| 2021/0335939 | A1 | 10/2021 | Li et al. | |
| 2022/0328578 | A1* | 10/2022 | Li | H10D 86/00 |
| 2024/0049575 | A1 | 2/2024 | Wang | |

FOREIGN PATENT DOCUMENTS

| | | | |
|---|---|---|---|
| CN | 108269833 | A | 7/2018 |
| CN | 109638055 | A | 4/2019 |
| CN | 109873089 | A | 6/2019 |
| CN | 110212006 | A | 9/2019 |
| CN | 112885976 | A | 6/2021 |
| CN | 113224110 | A | 8/2021 |
| CN | 113410267 | A | 9/2021 |
| CN | 113471383 | A | 10/2021 |
| CN | 113838995 | A | 12/2021 |
| TW | 202220205 | A | 5/2022 |
| WO | 2022061662 | A1 | 3/2022 |
| WO | 2022226737 | A1 | 11/2022 |

* cited by examiner

DISPLAY SUBSTRATE AND DISPLAY DEVICE

The application is a U.S. National Phase Entry of International Application No. PCT/CN2023/078510 filed Feb. 27, 2023, designating the United States of America. The present application claims priority to and the benefit of the above-identified application and the above-identified application is incorporated by reference herein in its entirety.

TECHNICAL FIELD

Embodiments of the present disclosure relates to a display substrate and a display device.

BACKGROUND

Compared with liquid crystal display (LCD) devices, organic electroluminescent devices such as organic light emitting diode (OLED) display devices have the advantages of self-luminescence, fast response, wide viewing angle, high brightness, bright colors, light weight and thin thickness, and are considered as the next generation display technology.

SUMMARY

Embodiments of the present disclosure provide a display substrate and a display device to enhance forward light emission, enhance light extraction effect, and improve light efficiency.

At least one embodiment of the present disclosure provides a display substrate, which includes: a base substrate; a light emitting element, located on the base substrate and comprising a first electrode, a second electrode, and a light emitting functional layer located between the first electrode and the second electrode; a pixel defining layer, comprising a pixel defining part and an opening configured to expose at least a part of the first electrode; and a filling layer, located on a side of the second electrode away from the base substrate; the pixel defining part comprises a light extraction structure, and a refractive index of the filling layer is greater than a refractive index of the light extraction structure.

For example, a lateral surface of the light extraction structure is a total reflection interface.

For example, the pixel defining part further comprises a main body, and a refractive index of the main body is different from the refractive index of the light extraction structure.

For example, the light extraction structure is at least located on a lateral surface of the main body.

For example, the main body is at least located on a lateral surface of the light extraction structure.

For example, the light extraction structure comprises a conductive reflective layer.

For example, the display substrate further includes a first conductive element, wherein the second electrode is connected with the first conductive element through the light extraction structure.

For example, the first conductive element and the first electrode are located in the same layer.

For example, the display substrate further includes a second conductive element, wherein the first conductive element is connected with the second conductive element.

For example, the display substrate further includes a pixel circuit, wherein the first electrode is connected with the pixel circuit, the pixel circuit is configured to drive the light emitting element, and the second conductive element is insulated from the pixel circuit.

For example, area of a surface of the light extraction structure away from the base substrate is smaller than area of a surface of the light extraction structure close to the base substrate, and area of an end of the opening away from the base substrate is larger than area of an end of the opening close to the base substrate.

For example, the main body is located on a side of the light extraction structure away from the base substrate.

For example, a maximum thickness of the main body is smaller than a maximum thickness of the light extraction structure.

For example, a largest dimension of a part of the filling layer located in the opening in a direction perpendicular to a main surface of the base substrate is greater than or equal to a smallest dimension of the light emitting element in the direction perpendicular to the main surface of the base substrate.

For example, the largest dimension of the part of the filling layer located in the opening in the direction perpendicular to the main surface of the base substrate is greater than or equal to 1.2 times the smallest dimension of the light emitting element in the direction perpendicular to the main surface of the base substrate.

For example, a difference between the refractive index of the filling layer and the refractive index of the light extraction structure is greater than or equal to 0.2.

For example, the refractive index of the filling layer is greater than or equal to 1.7, and the refractive index of the light extraction structure is less than or equal to 1.5.

For example, the display substrate further includes an encapsulation layer, wherein the encapsulation layer is configured to encapsulate the light emitting element, and the encapsulation layer is located on a side of the filling layer away from the base substrate.

At least one embodiment of the present disclosure further provides a display device, the display device comprises any one of the display substrates mentioned above.

BRIEF DESCRIPTION OF DRAWINGS

In order to illustrate the technical solutions of the embodiments of the present disclosure clearer, the drawings of the embodiments will be briefly described. Obviously, the drawings in the following only relate to some embodiments of the present disclosure, and are not intended to limit the present disclosure.

DETAILED DESCRIPTION

In order to make the purpose, technical scheme and advantages of the embodiment of the disclosure clearer, the technical scheme of the embodiment of the disclosure will be described clearly and completely with the attached drawings. Obviously, the described embodiment is a part of the embodiment of the present disclosure, not the whole embodiment. Based on the described embodiments of the present disclosure, all other embodiments obtained by ordinary people in the field without creative labor belong to the scope of protection of the present disclosure.

Unless otherwise defined, technical terms or scientific terms used in the present disclosure shall have their ordinary meanings as understood by people with ordinary skills in the field to which the present disclosure belongs. The terms “first”, “second” and the like used in the present disclosure do not indicate any order, quantity or importance, but are only used to distinguish different components. Similar words such as “including” or “containing” mean that the elements or objects appearing before the word cover the elements or objects listed after the word and their equivalents, without excluding other elements or objects. Similar words such as “connected” or “connected” are not limited to physical or mechanical connection, but can include electrical connection, whether direct or indirect.

The film-forming methods of light emitting elements such as OLED mainly include an evaporation process or a solution process. The application of evaporation process in small-size display devices is mature, and this technology has been applied to mass production at present. In the solution process, the main film-forming methods of OLED are inkjet printing, nozzle coating, spin coating, screen printing, etc. Among them, inkjet printing technology is considered to be an important way to achieve mass production of large-size OLED display devices because of its high material utilization rate and large size.

Light emitting elements, such as OLED, emit light, and some light with large incident angle will be reflected back into the display device and cannot be emitted. Therefore, the light extraction layer can be added to the outside of the light emitting side of the light emitting element to change the traveling route of light, so as to reduce the light confined in the OLED display device.

Embodiments of the present disclosure provide a display substrate, which enhances forward light emission, light extraction effect and light efficiency by adjusting the structure of a pixel defining layer.

Figure 1:
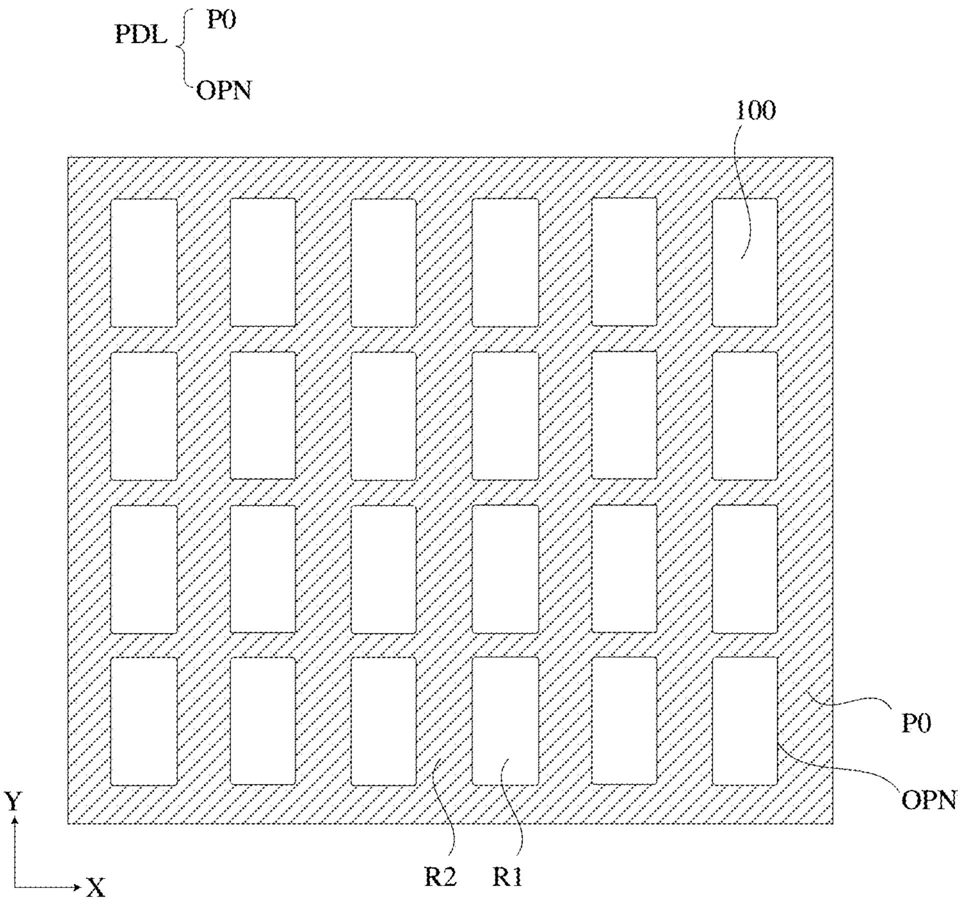
FIG. 1 is a plan view of a display substrate provided by an embodiment of the present disclosure.

FIG. 1 is a plan view of a display substrate provided by an embodiment of the present disclosure. As illustrated by FIG. 1, the display substrate includes a plurality of sub-pixels 100. FIG. 1 illustrates an example in which the plurality of sub-pixels 100 are arranged in an array. Of course, the arrangement of the plurality of sub-pixels 100 is not limited to that shown in the figure. The shape and size of the sub-pixel 100 are not limited to those shown in the figure. For example, the sub-pixel 100 can emit red, green, blue or white light as required, and of course, it can also emit light of other colors as appropriate. FIG. 1 shows a sub-pixel 100 with the light emitting region of the sub-pixel 100. The sub-pixel 100 shown in FIG. 1 is a light emitting region of a light emitting element.

FIG. 1 also shows a light emitting region R1 and a non-light emitting region R2. The non-light emitting region R2 is located between adjacent light emitting regions R1. As illustrated by FIG. 1, the light emitting region R1 corresponds to an opening OPN of a pixel defining layer PDL, while the non-light emitting region R2 corresponds to a region of the pixel defining layer PDL except the opening OPN.

FIGS. 2 to 7 are cross-sectional views of display substrates with different structures provided by some embodiments of the present disclosure. FIG. 8 is a plan view of a display substrate provided by an embodiment of the present disclosure.

As illustrated by FIGS. 1 to 7, the display substrate provided by an embodiment of the present disclosure includes a pixel defining layer PDL having a pixel defining part P0 and an opening OPN configured to expose at least a part of a first electrode E1. For example, as illustrated by FIG. 1, the opening OPN corresponds to the light emitting region R1.

For example, the non-light emitting region R2 corresponds to the pixel defining part P0, but which is not limited thereto. For example, the non-light emitting region R2 corresponds to a top surface of the pixel defining part P0, and the light emitting region R1 corresponds to a top surface of the opening OPN, but which is not limited thereto. For example, both the light emitting region R1 and the non-light emitting region R2 in the embodiment of the present disclosure are defined by the pixel defining layer PDL.

As illustrated by FIGS. 2 to 7, the opening OPN is defined by the pixel defining part P0, and the opening OPN is a through hole in the pixel defining layer PDL.

Figure 2:
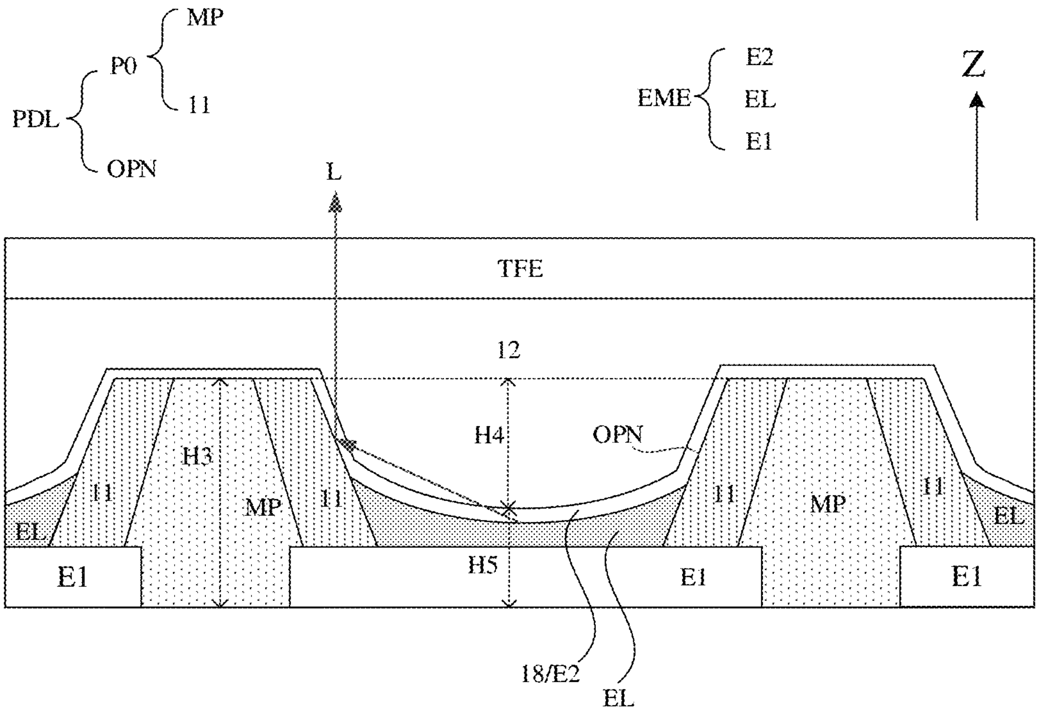
FIGS. 2 to 7 are cross-sectional views of display substrates with different structures provided by some embodiments of the present disclosure.
Figure 3:
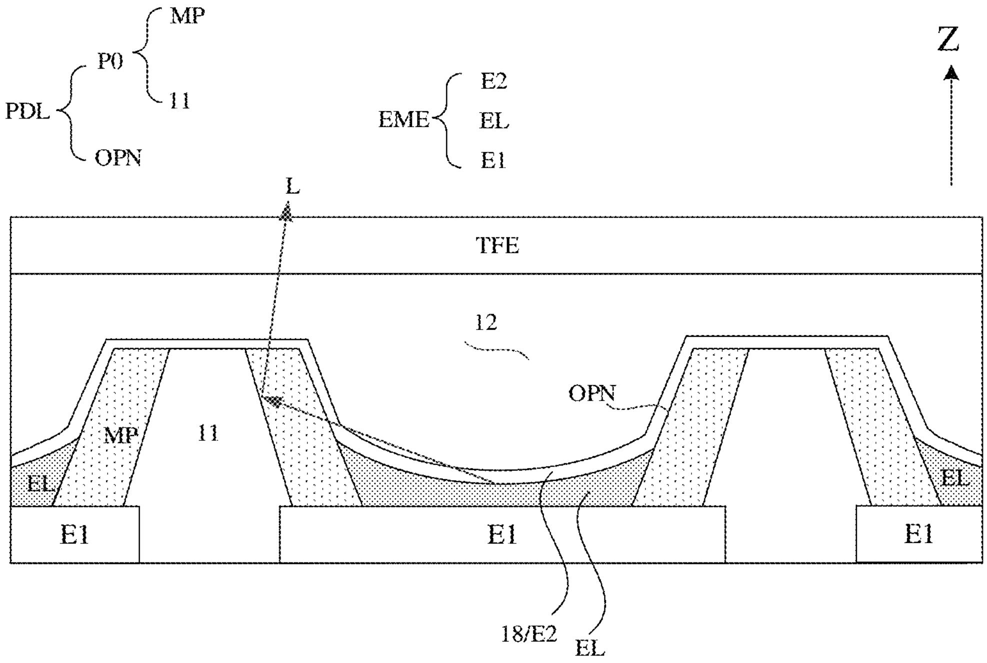
Figure 4:
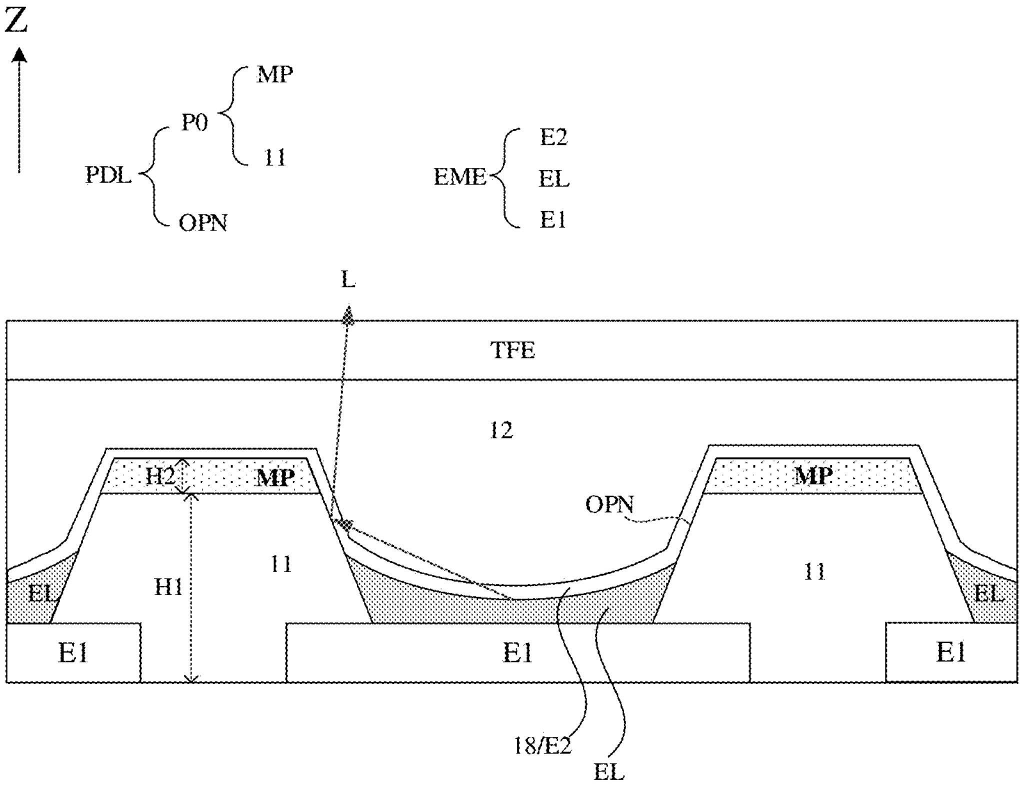
Figure 5:
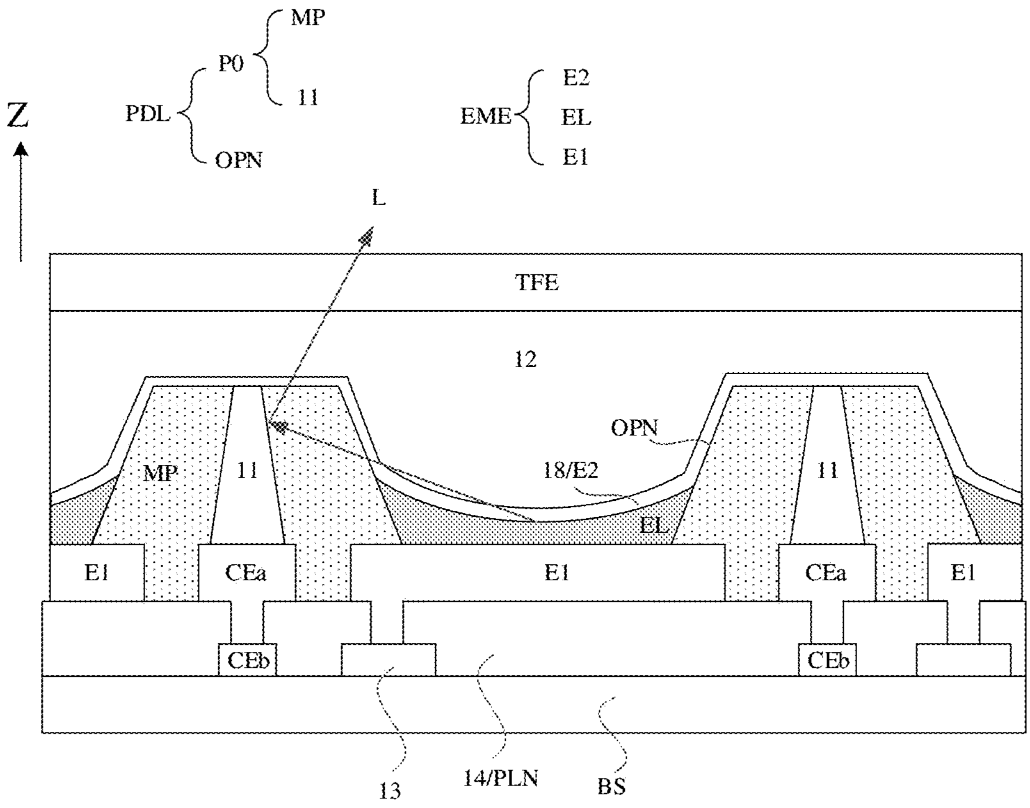
Figure 6:
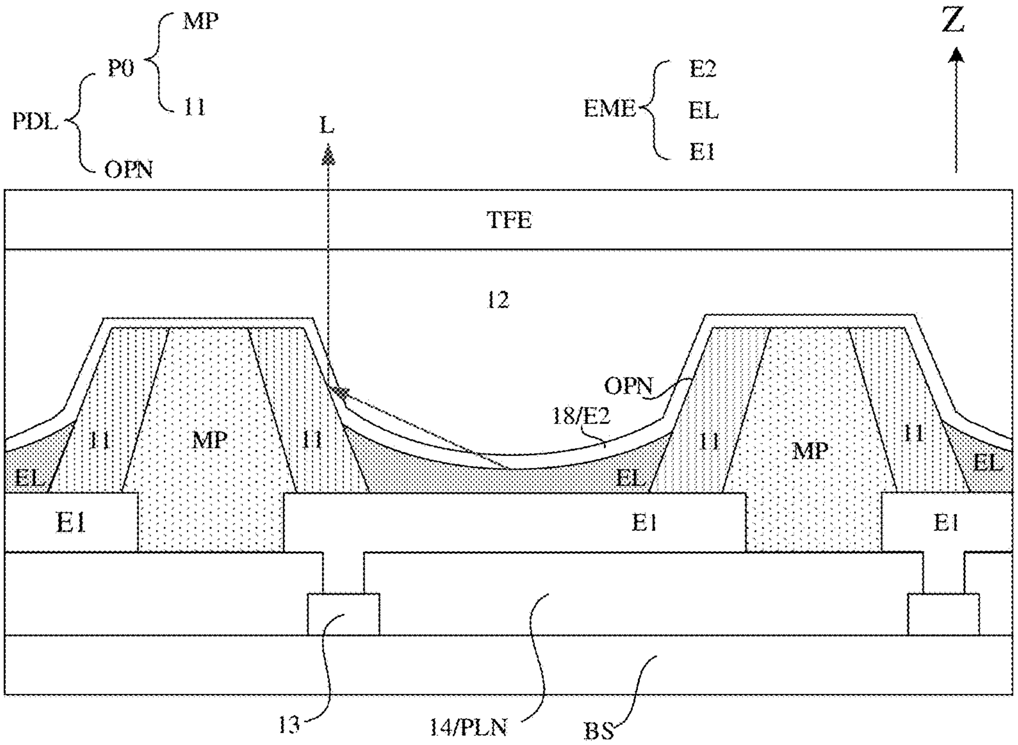
Figure 7:
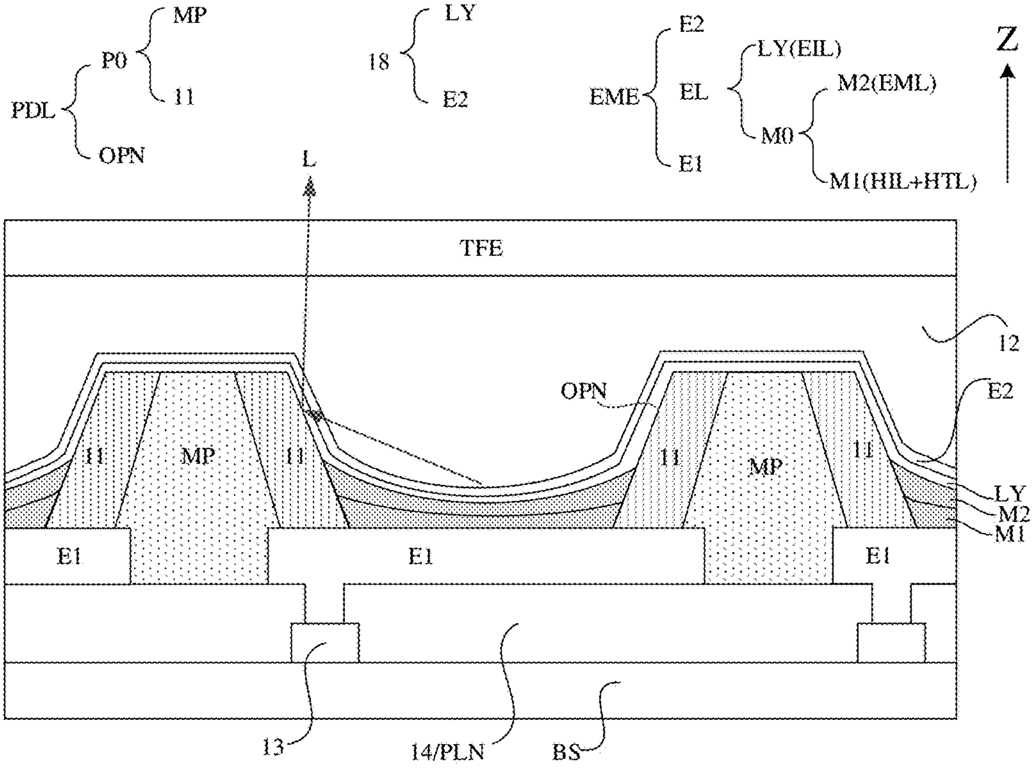
Figure 8:
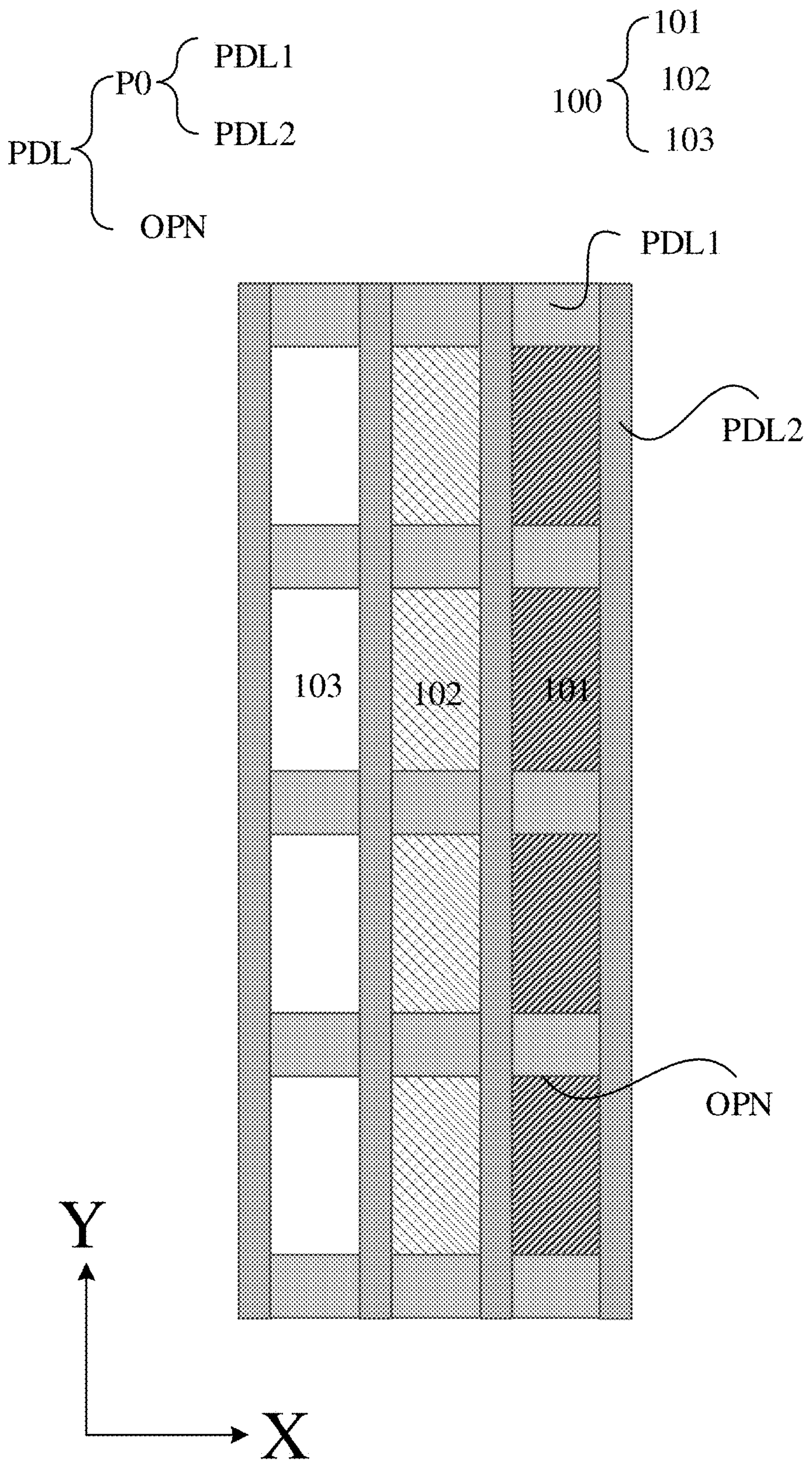
FIG. 8 is a plan view of a display substrate provided by an embodiment of the present disclosure.

As illustrated by FIGS. 5 to 7, the display substrate provided by the embodiment of the present disclosure includes a base substrate BS on which a light emitting element EME is located. The light emitting element EME includes a first electrode E1, a second electrode E2, and a light emitting functional layer EL located between the first electrode E1 and the second electrode E2. FIGS. 2 to 4 omit the structure under the first electrode E1, such as the base substrate and the pixel circuit. The display substrate shown in FIGS. 2 and 4 can also be supplemented with the base substrate and pixel circuit shown in FIGS. 6 and 7.

For example, the light emitting element EME includes an OLED, but which is not limited thereto.

As illustrated by FIGS. 2 to 7, the display substrate provided by the embodiment of the present disclosure further includes a filling layer 12, and the filling layer 12 is located on a side of the second electrode E2 away from the base substrate BS. That is, after the second electrode E2 is formed, the filling layer 12 is formed.

As illustrated by FIGS. 2 to 7, in the display substrate provided by the embodiment of the present disclosure, the pixel defining part P0 includes a light extraction structure 11, and a refractive index of the filling layer 12 is greater than a refractive index of the light extraction structure 11.

In the display substrate provided by the embodiment of the present disclosure, the pixel defining part P0 includes the light extraction structure 11, and the light emitted by the light emitting element EME is irradiated to the light extraction structure 11 through the filling layer 12. Because the refractive index of the filling layer 12 is greater than the refractive index of the light extraction structure 11, a total reflection interface can be formed on a surface of the light extraction structure 11 to emit the light irradiated to the light extraction structure 11 toward a light emitting side of the display substrate, so as to extract more light, enhance forward light extraction, enhance light extraction effect, enhance light efficiency, and improve the display effect.

The display substrate provided by the embodiment of the present disclosure simplifies the manufacturing process and is easy for mass production.

FIG. 2 to FIG. 7 show the light L. The light L is emitted by the light emitting element EME, irradiated to the light extraction structure 11 through the filling layer 12, and exits at the light emitting side. The upper side of the display substrate in FIGS. 2 to 7 is the light emitting side.

The material of the light extraction structure 11 is different from the material of the filling layer 12. The refractive index of the filling layer 12 is different from the refractive index of the light extraction structure 11.

As illustrated by FIGS. 2 to 7, a lateral surface of the light extraction structure 11 is a total reflection interface. That is, the light emitted by the light emitting element EME and irradiated to the lateral surface of the light extraction structure 11 can be utilized by total reflection.

For example, in order to obtain better light extraction effect, the difference between the refractive index of the filling layer 12 and the refractive index of the light extraction structure 11 is greater than or equal to 0.2. In other embodiments, the difference between the refractive index of the filling layer 12 and the refractive index of the light extraction structure 11 is greater than or equal to 0.3.

As illustrated by FIGS. 2 to 7, the pixel defining part P0 further includes a main body MP, and a refractive index of the main body MP is different from a refractive index of the light extraction structure 11. For example, a material of the main body MP is different from a material of the light extraction structure 11.

For example, as illustrated by FIGS. 2, 6 and 7, the light extraction structure 11 is at least located on a lateral side of the main body MP. In some embodiments, the main body MP can be formed firstly, and then the light extraction structure 11 located on the lateral side of the main body MP can be formed. FIG. 2, FIG. 6, and FIG. 7 illustrate that an orthographic projection of the main body MP on the base substrate and an orthographic projection of the first electrode E1 on the base substrate are not overlapped with each other. In other embodiments, the main body MP may be located between adjacent first electrodes E1, and the orthographic projection of the main body MP on the base substrate is not overlapped with the orthographic projection of the first electrode E1 on the base substrate.

As illustrated by FIGS. 2, 6 and 7, an interface between the light extraction structure 11 and the second electrode E2 is a total reflection interface.

For example, as illustrated by FIG. 3, the main body MP is at least located on a lateral side of the light extraction structure 11. In some embodiments, the light extraction structure 11 can be formed firstly, and then the main body MP located on the lateral side of the light extraction structure 11 can be formed.

As illustrated by FIG. 3, the interface between the light extraction structure 11 and the main body MP is a total reflection interface.

As illustrated by FIG. 4, the main body MP is located on a side of the light extraction structure 11 away from the base substrate BS. That is, the main body MP is located above the light extraction structure 11. As illustrated by FIG. 4, the interface between the light extraction structure 11 and the second electrode E2 is a total reflection interface.

As illustrated by FIG. 4, the maximum dimension H1 of the light extraction structure 11 in a direction perpendicular to the main surface of the base substrate BS (direction Z) is greater than the maximum dimension H2 of the main body MP in the direction perpendicular to the main surface of the base substrate BS (direction Z). That is, the maximum thickness of the main body MP is smaller than the maximum thickness of the light extraction structure 11.

In some drawings of embodiments of the present disclosure, a plan view shows a direction X and a direction Y, and a cross-sectional view shows a direction Z. Both the direction X and the direction Y are parallel to the main surface of the base substrate BS. The direction Z is perpendicular to the main surface of the base substrate BS. For example, direction X intersects with direction Y. The embodiment of the present disclosure is explained by taking the direction X and the direction Y as an example. For example, the main surface of the base substrate BS is the surface of the base substrate BS for manufacturing various elements. The upper surface of the base substrate BS in the sectional view is the main surface of the base substrate BS. The direction Z is perpendicular to the direction X and perpendicular to the direction Y.

As illustrated by FIGS. 2 to 7, the main body MP can be made of a lyophobic material. For example, the main body MP is made of a fluorine-containing material. For example, the fluorine-containing material includes at least one of fluorine-containing polyimide and fluorine-containing acrylic, but is not limited thereto.

Of course, the material of the main body MP is not limited to the lyophobic material, and the main body MP can also be made of a hydrophilic materials and a lyophobic material, for example, the main body MP can include a hydrophilic layer and a lyophobic layer. For example, the hydrophilic material includes at least one of polyimide and acrylic, but is not limited thereto.

For example, as illustrated by FIG. 5, the light extraction structure 11 is a conductive reflective layer, which has the effect of reflecting light. For example, as illustrated by FIG. 5, the material of the light extraction structure 11 includes metal, but is not limited thereto. For example, the metal includes silver (Ag), but is not limited thereto. The main body MP is located on an outer side of the light extraction structure 11, and is in contact with the lateral surface of the light extraction structure 11. As illustrated by FIG. 5, the interface between the light extraction structure 11 and the main body MP is a total reflection interface.

For example, as illustrated by FIG. 5, the display substrate further includes a first conductive element CEa, and the second electrode E2 is connected with the first conductive element CEa through the light extraction structure 11.

For example, as illustrated by FIG. 5, the first conductive element CEa and the first electrode E1 are located in the same layer. The first conductive element CEa and the first electrode E1 are formed by the same film layer and the same patterning process.

For example, as illustrated by FIG. 5, the display substrate further includes a second conductive element CEb, and the first conductive element CEa is connected to the second conductive element CEb.

For example, as illustrated by FIG. 5, the display substrate further includes a pixel circuit 13, the first electrode E1 is connected to the pixel circuit 13, the pixel circuit 13 is configured to drive the light emitting element EME, and the second conductive element CEb is insulated from the pixel circuit 13. FIG. 5 schematically shows the pixel circuit 13, and the second conductive element CEb may be located in the same layer as a conductive part in the pixel circuit 13. The second conductive element CEb and the conductive part arranged in the same layer with the second conductive element CEb have a gap therebetween and are insulated from each other.

In the display substrate provided by some embodiments of the present disclosure, the conductive reflective layer is used as the light extraction structure 11 to enhance the forward light emission, enhance the light extraction effect and improve the light effect, and the light extraction structure 11 is used as the connection element, so that the second electrode E2 is connected with the first conductive element CEa/the second conductive element CEb to reduce the resistance, further reduce the voltage drop and improve the display effect.

As illustrated by FIGS. 5 to 7, the first electrode E1 is connected to the pixel circuit 13. The pixel circuit 13 may include a transistor (T) and a storage capacitor (Cs), but is not limited thereto. For example, the pixel circuit 13 includes pixel circuits of 3T1C, 5T1C, 5T2C, 7T1C and 7T2C, but which is not limited thereto. The number of transistors and the number of storage capacitors included in the pixel circuit 13 can be determined as required.

As illustrated by FIGS. 5 to 7, the display substrate further includes an insulating layer 14, and the first electrode E1 is located on the insulating layer 14 and connected to the pixel circuit 13 through a via hole penetrating through the insulating layer 14.

As illustrated by FIG. 7, the first conductive element CEa is located on the insulating layer 14 and connected to the second conductive element CEb through a via hole penetrating through the insulating layer 14.

For example, as illustrated by FIGS. 2 to 7, the area of a surface of the light extraction structure 11 away from the base substrate BS is less than or equal to the area of a surface of the light extraction structure 11 away from the base substrate BS, and the area of an end of the opening OPN away from the base substrate BS is larger than the area of an end of the opening OPN away from the base substrate BS. FIGS. 2, 6 and 7 show that the area of a surface of the light extraction structure 11 away from the base substrate BS is equal to the area of a surface of the light extraction structure 11 close to the base substrate BS. FIGS. 3 to 5 show that the area of the surface of the light extraction structure 11 away from the base substrate BS is smaller than that of the surface of the light extraction structure 11 close to the base substrate BS.

For example, as illustrated by FIG. 2 to FIG. 7, in order to better achieve improving light extraction effect by the total reflection, the maximum dimension H4 of a part of the filling layer 12 located in the opening OPN in the direction perpendicular to the main surface of the base substrate BS is greater than or equal to the minimum dimension H5 of the light emitting element EME in the direction perpendicular to the main surface of the base substrate BS. Of course, in other embodiments, the maximum size H4 may be smaller than the minimum size H5, in which case the minimum size H5 may be 1.3-1.5 times the maximum size H4.

For example, as illustrated by FIGS. 2 to 7, the maximum dimension H4 of a part of the filling layer 12 located in the opening OPN in the direction perpendicular to the main surface of the base substrate BS is greater than or equal to 1.2 times the minimum dimension H5 of the light emitting element EME in the direction perpendicular to the main surface of the base substrate BS. For example, the maximum dimension H4 is greater than or equal to 1.5 times the minimum dimension H5. For example, the largest dimension H4 is greater than or equal to 1.8 times the smallest dimension H5. Further, for example, the maximum dimension H4 is greater than or equal to 2 times the minimum dimension H5. The largest dimension H4 is less than or equal to 2.5 times the smallest dimension H5. The minimum dimension H5 may also be the thickness of the light emitting element EME at the center position of the light emitting element.

For example, as illustrated by FIGS. 2 to 7, the maximum dimension H4 is less than or equal to 3 times the minimum dimension H5.

As illustrated by FIG. 2, the maximum thickness H3 of the pixel defining layer PDL may be the sum of the maximum size H4 and the minimum size H5.

For example, the maximum thickness H3 of the pixel defining layer PDL ranges from 1 μm to 1.5 μm, and for example, it may be 1.2 μm.

For example, the thickness of the first electrode E1 is about 100-150 nm, and may be 120 nm, for example.

For example, the thickness of the second electrode E2 is about 12-18 nm, and may be 15 nm, for example.

For example, the thickness of the light emitting functional layer EL is about 200-400 nm, and further, for example, it is 300-400 nm.

For example, the minimum dimension H5 of the light emitting element EME in the direction perpendicular to the main surface of the base substrate BS is about 312-568 nm.

Of course, the numerical values of various specific dimensions are only examples, and the dimensions of various components can be adjusted as required.

FIG. 2 shows the maximum thickness H3, the maximum size H4 and the minimum size H5, and the maximum thickness H3, the maximum size H4 and the minimum size H5 in other cross-sectional views can be referred to FIG. 2.

In the embodiment of the present disclosure, the thickness of an element refers to the dimension of the element in the direction Z. The direction Z is the direction perpendicular to the main surface of the base substrate.

For example, as illustrated by FIGS. 2 to 7, the refractive index of the filling layer 12 is greater than or equal to 1.7. For example, the material of the filling layer 12 includes a matrix material and filling particles doped therein. For example, the filling particles include at least one of zirconium oxide particles and titanium oxide particles, but are not limited thereto and may be determined as required. Because the filling particles have higher refractive index, the filling layer 12 can have a higher refractive index. The size of the filling particles is in the nanometer scale.

The refractive index of the filling particles is greater than the refractive index of the matrix material. For example, the filling particles can also be called high refractive index particles. Setting filling particles with high refractive index in the matrix material can make the refractive index of the filling layer 12 larger than the refractive index of the matrix material and smaller than the refractive index of the filling particles. The larger the filling amount of the filling particles, the larger the refractive index of the filling layer 12.

For example, the matrix material of the filling layer 12 includes at least one of acrylic resin and epoxy resin, but other suitable materials can also be used.

The refractive index of epoxy resin is about 1.5-1.57, and the refractive index of epoxy resin with filling particles can be greater than or equal to 1.7. For example, in some embodiments, the filling layer 12 is made of epoxy resin with filling particles, and the refractive index is about 1.7 or 1.8.

The refractive index of acrylic resin is about 1.5, and the refractive index of acrylic resin with filling particles can be greater than or equal to 1.7. For example, in some embodiments, the filling layer 12 is made of acrylic resin with filling particles, and the refractive index is about 1.7.

For example, as illustrated by FIGS. 2 to 7, the refractive index of the light extraction structure 11 is less than or equal to 1.5. For example, the material of the light extraction structure 11 includes acrylic resin (refractive index is about 1.5).

For example, the display substrate further includes an encapsulation layer TFE configured to encapsulate the light emitting element EME, and the encapsulation layer TFE is located on the side of the filling layer 12 away from the base substrate BS. The encapsulation layer TFE encapsulates the light emitting element EME to avoid water and oxygen invasion.

For example, the encapsulation layer TFE can be a thin film encapsulation layer. For example, in the embodiment of the present disclosure, the material of the encapsulation layer TFE may also include an inorganic encapsulation film, an organic encapsulation film, and a stack of inorganic encapsulation films. For example, the material of the inorganic encapsulation film includes at least one of silicon oxide (SiOx), silicon nitride (SiNx), and silicon oxynitride, and the material of the organic encapsulation film includes an organic resin, but it is not limited thereto.

As illustrated by FIG. 7, the light emitting functional layer EL includes a common layer LY and a cell structure layer M0, the common layer LY is shared by a plurality of sub-pixels, and the cell structure layer M0 is located in one opening OPN.

As illustrated by FIG. 7, the common layer LY includes an electron injection layer EIL, but it is not limited thereto, and may be determined as required.

As illustrated by FIG. 7, the cell structure layer M0 includes a cell structure layer M1 and a cell structure layer M2. For example, the cell structure layer M1 includes at least one of a hole injection layer HIL and a hole transport layer HTL, and the cell structure layer M2 includes a light emitting layer EML. In the embodiment of the present disclosure, the hole injection layer HIL, the hole transport layer HT, the light emitting layer EML, and the electron injection layer EIL can all be made of common materials.

As illustrated by FIGS. 2 to 7, there is a spacing layer 18 between the filling layer 12 and the light extraction structure 11. As illustrated by FIGS. 2 to 6, the spacing layer 18 includes the second electrode E2. As illustrated by FIG. 7, the spacing layer 18 is the second electrode E2 and the common layer LY. For example, the thickness of the second electrode E2 is about dozen nanometers, for example, 12-18 nm, and the thickness of the common layer LY (electron injection layer EIL) usually ranges from several tens nanometers to more than one hundred nanometers. Due to the small thickness of the spacing layer 18, some light may be absorbed, but the total reflection interface is not affected, that is, in the case that the spacing layer 18 exists, the total reflection interface is still at the side of the light extraction structure 11.

As illustrated by FIGS. 2 to 7, the display substrate has a top emission structure. The upper side of the display substrate shown in FIGS. 2 to 7 is the light emitting side.

As illustrated by FIG. 8, the pixel defining part P0 includes a first pixel defining part PDL1 and a second pixel defining part PDL2, the first pixel defining part PDL1 extends along the direction X and the second pixel defining part PDL2 extends along the direction Y, and a plurality of first pixel defining parts PDL1 arranged at intervals along the direction X are arranged between two adjacent second pixel defining parts PDL2.

For example, the thickness of the first pixel defining part PDL1 is smaller than that of the second pixel defining part PDL2. That is, the size of the first pixel defining part PDL1 in the direction Z is smaller than the size of the second pixel defining part PDL2 in the direction Z, so as to facilitate the manufacture of at least one film layer in the light emitting functional layer by adopting an inkjet printing process.

For example, the structure of the first pixel defining part PDL1 is different from the structure of the second pixel defining part PDL2.

For example, the second pixel defining part PDL2 may adopt the above-mentioned pixel defining layer PDL with the light extraction structure 11. For example, the first pixel defining part PDL1 uses a commonly used pixel defining material.

As illustrated by FIG. 8, the sub-pixel 100 includes a first sub-pixel 101, a second sub-pixel 102, and a third sub-pixel 103. For example, the first sub-pixel 101, the second sub-pixel 102, and the third sub-pixel 103 are sub-pixels that emit different colors of light. The embodiment of the present disclosure is explained by taking the example that the first sub-pixel 101 is a red sub-pixel, the second sub-pixel 102 is a green sub-pixel, and the third sub-pixel 103 is a blue sub-pixel. For example, a pixel includes at least three sub-pixels that emit light of different colors. For example, a pixel includes a first sub-pixel 101, a second sub-pixel 102, and a third sub-pixel 103.

As illustrated by FIG. 8, taking the direction X as the row direction and the direction Y as the column direction as an example, a column of sub-pixels emits light of the same color.

As illustrated by FIG. 8, the size of the light emitting region (light emitting element) of a sub-pixel in the direction Y (the size of the long axis) is related to the pixel resolution. For example, the size of the light emitting region (light emitting element) of the sub-pixel in the direction Y (the size of the long axis) is about 50-150 μm, but it is not limited thereto. Generally, for a 255 PPI display substrate, the size of the long axis of the sub-pixel is about 75 μm, and for a 160 PPI display substrate, the size of the long axis of the sub-pixel is about 105 μm. PPI is the number of the pixels per inch.

As illustrated by FIG. 8, the size of the light emitting region (light emitting element) of the sub-pixel in the direction X (the size of the minor axis) is about 30-50 μm, but it is not limited thereto.

As illustrated by FIG. 2, FIG. 6 and FIG. 7, an embodiment of the present disclosure provides a display substrate, in which a pixel defining layer beneficial to enhancing the light extraction effect is adopted, a pixel defining layer PDL is formed on a first electrode E1 in a sub-pixel shape with a lyophobic material, an upper surface of a main body MP of the pixel defining layer PDL is lyophobic, and a light extraction structure 11 (low refractive index film layer) is arranged on a lateral side of the main body MP of the pixel defining layer PDL, and the refractive index of the light extraction structure 11 is less than or equal to 1.5; a light emitting function (EL) layer is made in the sub-pixel by inkjet printing, and a filling layer 12 is arranged above the light emitting function layer EL. The filling layer 12 includes a matrix material and filling particles, and the filling particles have a higher refractive index, and the refractive index of the filling layer 12 is higher than 1.7, and an encapsulation layer TFE is arranged on the filling layer 12. The light with large angle emitted from the light emitting functional layer EL to the lateral side of the pixel defining structure P0 of the pixel defining layer PDL is totally reflected on the light extraction structure 11, thereby reflecting the lateral light to the forward direction. Therefore, this structure can enhance the forward light emission of the light emitting element.

Next, the manufacturing method of the display substrate shown in FIGS. 2, 6 and 7 will be further described in detail with reference to the drawings. The manufacturing method of the display substrate is provided as follows.

(1) Forming a pixel circuit 13 on a base substrate BS.

(2) Forming a planarization layer PLN (insulating layer 14) on the pixel circuit 13.

(3) Forming a first electrode E1 on the planarization layer PLN (insulating layer 14).

(4) Forming a main body MP of a pixel defining layer PDL on the first electrode E1.

(5) Forming a light extraction structure 11 (low refractive index film layer) on a lateral side of the main body MP of the pixel defining layer PDL, and the refractive index of the light extraction structure 11 is less than 1.5.

(6) Forming a light emitting functional layer EL by an inkjet printing process.

(7) Forming a second electrode E2 on the light emitting functional layer EL.

(8) Forming a filling layer FL on the second electrode E2, the refractive index of the filling layer FL is higher than 1.7.

(9) Forming an encapsulation layer ECS on the filling layer FL.

For example, in step (1), the pixel circuit 13 includes a thin film transistor and a storage capacitor.

For example, in step (2), the shape of the first electrode E1 coincides with the shape of the sub-pixel.

As illustrated by FIG. 3, firstly, the light extraction structure 11 is formed by using a low refractive index material, for example, the cross section of the light extraction structure 11 has a trapezoidal shape, and the refractive index is less than 1.5; then, the main body MP of the pixel definition layer PDL is formed by using a lyophobic material on an outer side of the light extraction structure 11, and the refractive index of the main body MP is about 1.65, the light emitting functional layer EL is formed in the sub-pixel by an inkjet printing process, and the second electrode E2 is formed on the light emitting functional layer EL, and a filling layer 12 is formed on the second electrode E2, the filling layer 12 is a structure in which filling particles are doped in a matrix material, and the refractive index of the filling layer 12 is higher than 1.7, and then an encapsulation layer TFE is formed on the filling layer 12 to complete the encapsulation. The light with a large angle emitted from the light emitting functional layer EL to the lateral side of the pixel defining structure P0 (light extraction structure 11) is totally reflected by the light extraction structure 11 with a low refractive index, thereby reflecting the lateral light to the forward direction. Therefore, this structure can enhance the forward light emission of the light emitting element.

As illustrated by FIG. 4, firstly, the light extraction structure 11 is formed by using a low refractive index material, and the cross section of the light extraction structure 11 has a trapezoidal shape, and the refractive index is less than 1.5; then, the main body MP of the pixel definition layer PDL is formed by using a lyophobic material on the light extraction structure 11, and the refractive index of the main body MP is about 1.65. The light emitting functional layer EL is formed in the sub-pixel by an inkjet printing process, and the second electrode E2 is formed on the light emitting functional layer EL, and a filling layer 12 is formed on the second electrode E2, the filling layer 12 is a structure in which filling particles are doped in a matrix material, and the refractive index of the filling layer 12 is higher than 1.7, and then an encapsulation layer TFE is formed on the filling layer 12 to complete the encapsulation. The light with large angle emitted from the light emitting functional layer EL to the lateral surface of the pixel defining structure P0 (light extraction structure 11) is totally reflected on the light extraction structure 11 with low refractive index, thereby reflecting the lateral light to the forward direction. Therefore, this structure can enhance the forward light emission of the light emitting element.

As illustrated by FIG. 5, firstly, a planarization layer PLN (insulating layer 14) is formed on the pixel circuit 13 and a second conductive element CEb, and then a first conductive element CEa and a first electrode E1 are formed on the planarization layer PLN (insulating layer 14); then, a light extraction structure 11 is formed by using a high-reflectivity metal, the cross section of the light extraction structure 11 can be a trapezoidal shape, and the high-reflectivity metal can be silver (Ag), and the thickness of the light extraction structure 11 is smaller than that of the main body MP. The thickness of the light extraction structure 11 is less than 1.2 μm. For example, the thickness of the light extraction structure 11 may ranges from 0.8 μm to 1.1 μm, but it is not limited thereto and may be determined as required. Then, the main body MP of the pixel definition layer PDL is formed by using a lyophobic material on an outer side of the light extraction structure 11, and the refractive index of the main body M is about 1.65. In the sub-pixel, the light emitting functional layer EL is formed by an inkjet printing process, and the second electrode E2 is formed on the light emitting functional layer EL, and the filling layer 12 is formed on the second electrode E2. The filling layer 12 is a structure in which the matrix material is doped with filling particles, and the refractive index of the filling layer 12 is higher than 1.7. Then, the encapsulation layer TFE is formed on the filling layer 12. The light with large angle emitted from the light emitting functional layer EL to the lateral side of the pixel defining layer PDL (light extraction structure 11) is reflected by the light extraction structure 11 with high reflectivity, thereby reflecting the lateral light to the forward direction. Therefore, this structure can enhance the forward light emission of the light emitting element. In addition, the light extraction structure 11 made of high-reflectivity metal can be connected to the second electrode E2 as an auxiliary electrode, thereby reducing the voltage drop of the large-size display substrate.

In the embodiment of the present disclosure, as illustrated by FIGS. 5 to 7, the thickness of the planarization layer PLN (insulating layer 14) is about 1 to 2 μm, but it is not limited thereto, and may be determined as required.

As illustrated by FIG. 8, on the basis of the conventional line bank structure, the first pixel defining part PDL1 is formed by using a low refractive index material, and the second pixel defining part PDL2 is made of the pixel defining layer PDL with light extraction structure and a lyophobic material in the above embodiment, and the light emitting functional layer EL is formed in the sub-pixel by an inkjet printing process. Because of the line bank structure of the pixel defining layer PDL, ink can be circulated in the whole column, so as to improve the uniformity in the sub-pixel of the light emitting functional layer EL. A second electrode E2 is formed on the light emitting functional layer EL, and a filling layer 12 is formed on the second electrode E2. The filling layer 12 is a structure in which filling particles are doped in a matrix material, and the refractive index of the filling layer 12 is higher than 1.7 μm. Then, an encapsulation layer TFE is formed on the filling layer 12 to complete the encapsulation. The light with large angle light emitted from the light emitting functional layer E to the lateral side of the pixel defining layer PDL is totally reflected on the light extraction structure 11 with low refractive index, thereby reflecting the lateral light to the forward direction, so this structure can enhance the forward light emission of the OLED.

For example, in the embodiment of the present disclosure, the insulating layer 14 includes at least one of an inorganic insulating layer and an organic insulating layer. For example, the inorganic insulating materials include silicon oxide, silicon nitride, silicon oxynitride, etc., and the organic insulating materials include resin, but are not limited thereto.

For example, the base substrate BS includes a flexible material such as polyimide or a rigid material such as glass, but it is not limited thereto.

For example, one of the first electrode E1 and the second electrode E2 is an anode, and the other of the first electrode E1 and the second electrode E2 is a cathode.

For example, the material of the first electrode E1 of the light emitting element includes a conductive material, for example, at least one of silver (Ag) or indium tin oxide (ITO), but it is not limited thereto. For example, the first electrode E1 of the light emitting element has a structure in which three layers of ITO/Ag/ITO are stacked, but it is not limited thereto. In other embodiments, the material of the first electrode E1 of the light emitting element includes aluminum (Al) and tungsten oxide (WOx). For example, the first electrode E1 includes a stack of an aluminum layer and a tungsten oxide layer, and the aluminum layer is closer to the base substrate than the tungsten oxide layer.

For example, the material of the second electrode E2 of the light emitting element includes a conductive material, for example, at least one of magnesium (Mg), silver (Ag), or indium zinc oxide (IZO), but it is not limited thereto. For example, in some embodiments, the material of the second electrode E2 of the light emitting element includes a Mg/Ag alloy.

For example, at least one of the first conductive element CEa and the second conductive element CEb may be made of a conductive material such as a metal material.

A light emitting element generally includes a first electrode, a light emitting functional layer, and a second electrode sequentially formed on a base substrate. For example, the light emitting functional layer includes a light emitting layer, and in other embodiments, the light emitting functional layer includes at least one of a hole transport layer, a hole injection layer, an electron injection layer and an electron transport layer in addition to the light emitting layer. For example, the light emitting element includes the following structures formed in sequence: a first electrode, a hole injection layer, a hole transport layer, a light emitting layer, an electron injection layer, an electron transport layer, and a second electrode. For example, the first electrode is an anode and the second electrode is a cathode, but it is not limited thereto.

In the embodiment of the present disclosure, the interface between one element and another element refers to the contact surface of the two elements.

At least one embodiment of the present disclosure provides a display device, including any one of the display substrates. For example, the display device can be a TV, a digital camera, a mobile phone, a watch, a tablet computer, a notebook computer, a navigator and other products or components with display function, including an organic light emitting diode display device.

The above is only the specific implementation of this disclosure, but the protection scope of this disclosure is not limited thereto. Any person familiar with this technical field can easily think of changes or substitutions within the technical scope disclosed in this disclosure, which should be included in the protection scope of this disclosure. Therefore, the scope of protection of this disclosure should be based on the scope of protection of the claims.

The invention claimed is:

1. A display substrate comprising:

a base substrate;

a light emitting element, located on the base substrate and comprising a first electrode, a second electrode, and a light emitting functional layer located between the first electrode and the second electrode;

a pixel defining layer, comprising a pixel defining part and an opening configured to expose at least a part of the first electrode, wherein the pixel defining part comprises a light extraction structure; and the display substrate further comprises a filling layer located on a side of the second electrode away from the base substrate and having a refractive index greater than a refractive index of the light extraction structure, wherein the filling layer has a planarized upper surface.

2. The display substrate according to claim 1, wherein a lateral surface of the light extraction structure is a total reflection interface.

3. The display substrate according to claim 1, wherein the pixel defining part further comprises a main body, and a refractive index of the main body is different from the refractive index of the light extraction structure.

4. The display substrate according to claim 3, wherein the light extraction structure is at least located on a lateral surface of the main body.

5. The display substrate according to claim 3, wherein the main body is at least located on a lateral surface of the light extraction structure.

6. The display substrate according to claim 5, wherein the light extraction structure comprises a conductive reflective layer.

7. The display substrate according to claim 6, further comprising a first conductive element, wherein the second electrode is connected with the first conductive element through the light extraction structure.

8. The display substrate according to claim 7, wherein the first conductive element and the first electrode are located in the same layer.

9. The display substrate according to claim 7, further comprising a second conductive element, wherein the first conductive element is connected with the second conductive element.

10. The display substrate according to claim 9, further comprising a pixel circuit, wherein the first electrode is connected with the pixel circuit, the pixel circuit is configured to drive the light emitting element, and the second conductive element is insulated from the pixel circuit.

11. The display substrate according to claim 6, wherein an area of a surface of the light extraction structure away from the base substrate is smaller than an area of a surface of the light extraction structure close to the base substrate, and an area of an end of the opening away from the base substrate is larger than an area of an end of the opening close to the base substrate.

12. The display substrate according to claim 3, wherein the main body is located on a side of the light extraction structure away from the base substrate.

13. The display substrate according to claim 12, wherein a maximum thickness of the main body is smaller than a maximum thickness of the light extraction structure.

14. The display substrate according to claim 1, wherein a largest dimension of a part of the filling layer located in the opening in a direction perpendicular to a main surface of the base substrate is greater than or equal to a smallest dimension of the light emitting element in the direction perpendicular to the main surface of the base substrate.

15. The display substrate according to claim 14, wherein the largest dimension of the part of the filling layer located in the opening in the direction perpendicular to the main surface of the base substrate is greater than or equal to 1.2 times the smallest dimension of the light emitting element in the direction perpendicular to the main surface of the base substrate.

16. The display substrate according to claim 1, wherein a difference between the refractive index of the filling layer and the refractive index of the light extraction structure is greater than or equal to 0.2.

17. The display substrate according to claim 1, wherein the refractive index of the filling layer is greater than or equal to 1.7, and the refractive index of the light extraction structure is less than or equal to 1.5.

18. The display substrate according to claim 1, further comprising an encapsulation layer, wherein the encapsulation layer is configured to encapsulate the light emitting element, and the encapsulation layer is located on a side of the filling layer away from the base substrate.

19. A display device, comprising the display substrate according to claim 1.

* * * * *